(12) United States Patent
Akin et al.

(10) Patent No.: US 11,852,600 B2
(45) Date of Patent: Dec. 26, 2023

(54) THERMAL CONTACT RESISTANCE MEASUREMENT MECHANISM

(71) Applicant: TUSAS- TURK HAVACILIK VE UZAY SANAYII ANONIM SIRKETI, Ankara (TR)

(72) Inventors: Deger Akin, Kazan/Ankara (TR); Dilek Kumlutas, Bornova/Izmir (TR); Furkan Kulak, Kazan/Ankara (TR)

(73) Assignee: TUSAS—TURK HAVACILIK VE UZAY SANAYII ANONIM SIRKETI, Ankara (TR)

( * ) Notice: Subject to any disclaimer, the term of this patent is extended or adjusted under 35 U.S.C. 154(b) by 311 days.

(21) Appl. No.: 17/417,331

(22) PCT Filed: Dec. 19, 2019

(86) PCT No.: PCT/TR2019/051126
§ 371 (c)(1),
(2) Date: Jun. 22, 2021

(87) PCT Pub. No.: WO2020/139266
PCT Pub. Date: Jul. 2, 2020

(65) Prior Publication Data
US 2022/0050069 A1    Feb. 17, 2022

(30) Foreign Application Priority Data
Dec. 28, 2018   (TR) ................. 2018/21024

(51) Int. Cl.
*G01N 25/18*    (2006.01)
*G01K 17/00*    (2006.01)
*G01R 33/38*    (2006.01)

(52) U.S. Cl.
CPC ............ *G01N 25/18* (2013.01); *G01K 17/00* (2013.01); *G01R 33/3804* (2013.01)

(58) Field of Classification Search
CPC .......... G01K 17/00; G01K 5/486; G01K 5/50; G01K 7/42; G01N 25/18; G01N 25/005
See application file for complete search history.

(56) References Cited

U.S. PATENT DOCUMENTS 5,940,784 A    8/1999   El-Husayni
6,142,662 A *  11/2000  Narh ..................... G01N 25/18
                                                      374/30
(Continued)

FOREIGN PATENT DOCUMENTS

JP    2022074017 A  *  5/2022  .............. G01N 1/42
KR    20110064349 A     6/2011
(Continued)

OTHER PUBLICATIONS

Tariq Andallib et al: "Experimental investigation of thermal contact conductance for nominally flat metallic contact", Heat and Mass Transfer, vol. 52, Apr. 10, 2015, pp. 291-307, http://dx.doi.org/10.1007/s00231-015-1551-1, retrieved Jun. 22, 2021.

(Continued)

*Primary Examiner* — Andre J Allen
(74) *Attorney, Agent, or Firm* — Notaro, Michalos & Zaccaria P.C.

(57) ABSTRACT

A measurement mechanism having a body and a vacuum chamber that is located on the body and in which a measurement process is performed is disclosed. A first sample and a second sample between which a heat transfer occurs are placed in the vacuum chamber and contact each other. A piston that provides the first sample and the second sample to continuously contact each other and a cooler that is located below the first sample and the second sample is also disclosed.

5 Claims, 2 Drawing Sheets

(56) References Cited

U.S. PATENT DOCUMENTS

| | | | | |
|---|---|---|---|---|
| 6,896,405 | B2* | 5/2005 | Osone | G01N 25/18 |
| | | | | 374/46 |
| 7,540,656 | B1* | 6/2009 | Stochl | G01N 25/18 |
| | | | | 374/31 |
| 8,066,429 | B2* | 11/2011 | Danley | G01K 17/00 |
| | | | | 374/10 |
| 11,327,034 | B2* | 5/2022 | Mori | G01N 25/18 |
| 2022/0074879 | A1* | 3/2022 | Akin | G01N 25/4853 |
| 2022/0099605 | A1* | 3/2022 | Akin | G01N 25/18 |
| 2022/0128497 | A1* | 4/2022 | Akin | G01K 17/00 |

FOREIGN PATENT DOCUMENTS

| | | | |
|---|---|---|---|
| KR | 20160064272 | A | 6/2016 |
| RU | 2488102 | C1 | 6/2016 |

OTHER PUBLICATIONS

Warzoha, Ronald J et al: "High resolution steady-state measurements of thermal contact resistance across thermal interface material junctions", Review of Scientific Instruments, vol. 88, Sep. 19, 2017, Article No. 094901, pp. 1-9.

Mcwaid, T H: "Thermal Contact Resistance Across Pressed Metal Contacts in a Vacuum Environment", PhD dissertation, Sep. 30, 1990, pp. 134-157.

International Search Report and Written Opinion for corresponding PCT application No. PCT/TR2019/051126, dated Jun. 12, 2020.

International Preliminary Report on Patentability for corresponding PCT application No. PCT/TR2019/051126, dated Dec. 16, 2020.

\* cited by examiner

THERMAL CONTACT RESISTANCE MEASUREMENT MECHANISM

The present invention relates to a measurement mechanism which provides measuring thermal contact resistance.

Especially in space and air vehicles, honeycomb sandwich panels having carbon fibre-reinforced plate surfaces are commonly used. While various equipment and components provided in space vehicles may be fixed directly to such panels, the fixing process is performed by means of supports. Equipment, components and/or supports which are fixed to these panels may be made of metallic materials. For that reason, precise determination of thermal contact resistance, which is generated as a result of fixing the equipment, components and/or supports to the panels, is a significant factor for thermal control design of the space vehicle. While measuring the thermal contact resistance, it is provided that at least two samples contact each other. A heat transfer occurs between two samples. Meanwhile, the thermal contact resistance is measured by performing a measurement. Said test is executed in an environment without air interaction. A pressure allows two samples to be in a continuous contact with each other. The continuous pressure is provided by means of a high power piston. In order to be able to measure the thermal contact resistance between two samples, measurement units which measure heat flux are used. However, a single measurement is not sufficient in order to accurately measure thermal contact resistance of the non-homogenous samples. Moreover, evaluating the thermal contact resistances which are measured at various regions does not always give accurate results.

US Patent Application No. U.S. Pat. No. 5,940,784 covered by the known art discloses a measurement method for heat flux.

In another published document having the title of "Experimental investigation of thermal contact conductance for nominally flat metallic contact"(TARIQ ANDALLIB ET AL: HEAT AND MASS TRANSFER, vol. 52, 10 Apr. 2015, pages 291-307) experimental investigation of thermal contact conductance for nominally flat metallic contact is disclosed. According to this document, two samples are contacted each other and one of them is heated by a heater block while other one is cooled by a cooling block. Heat exchange between said samples are measured by heat flux meters.

An object of the present invention is to realize a measurement mechanism which provides ease of measurement.

The measurement mechanism aimed to achieve the object of the present invention and disclosed in the claims comprises a body and a vacuum chamber which is located on the body. The vacuum chamber comprises therein a first sample and a second sample between which a heat transfer occurs, and a piston which exerts a continuous pushing force in order for the first sample and the second sample to contact each other.

The measurement mechanism, which is the subject matter of the present invention, comprises a heater located between piston and the first sample, a first heat flux converter located between the heater and the first sample, and a second heat flux converter located between the second sample and the cooler. Heat transfer between the samples is measured by means of the first heat flux converter and the second heat flux converter.

In an embodiment of the invention, the measurement mechanism comprises a control unit. Thanks to the control unit, it is provided that data received from the first heat flux converter and the second heat flux converter is compared. Therefore, thermal contact resistances of the samples are determined.

In an embodiment of the invention, the measurement mechanism comprises a first heat flux converter and the second heat flux converter which are located so as to substantially cover the first sample and the second sample. Thus, information regarding heat transfer is able to be obtained at all regions of the samples. Accurate results can also be achieved when the samples are non-homogeneous.

In an embodiment of the invention, the measurement mechanism comprises a heater having a plurality of tape heaters which are located side by side and parallel to each other. Thanks to the tape heaters, a unidirectional heat flow is performed between the samples.

In an embodiment of the invention, the measurement mechanism comprises air ducts which are located between the tape heaters. These air ducts provide homogenous heating.

In an embodiment of the invention, the measurement mechanism comprises tape heaters which are connected to each other by parallel circuits. Thus, the tape heaters are able to perform heating process independently of each other.

With the present invention, there is achieved a measurement mechanism in which heat flux converters facilitating measurement of the thermal contact resistance are used.

The measurement mechanism aimed to achieve the object of the present invention is illustrated in the attached figures, in which.

Figure 1:
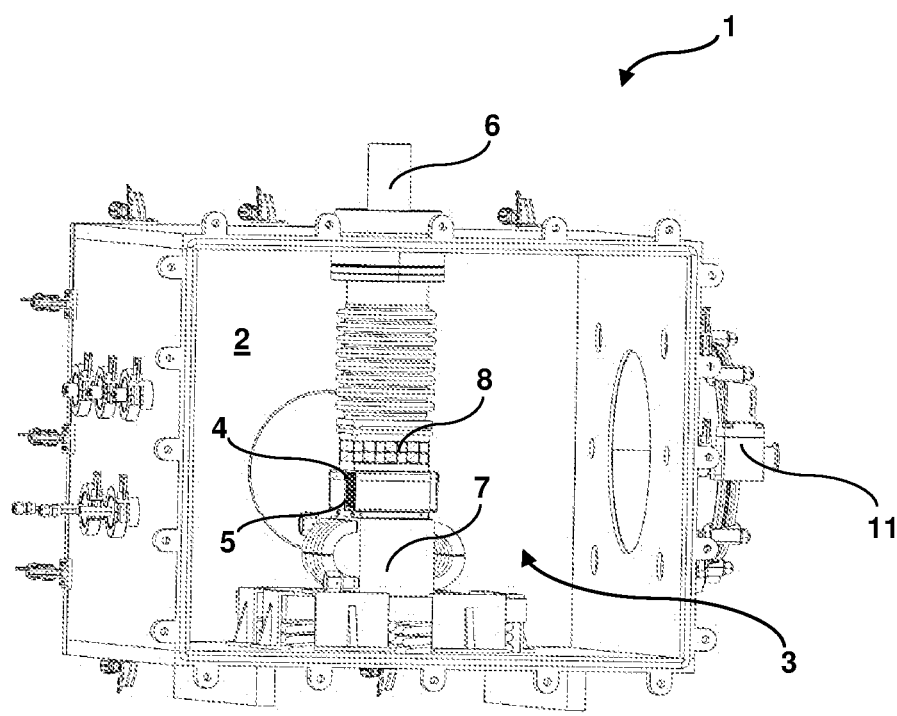
FIG. 1 is a perspective view of a measurement mechanism.
Figure 2:
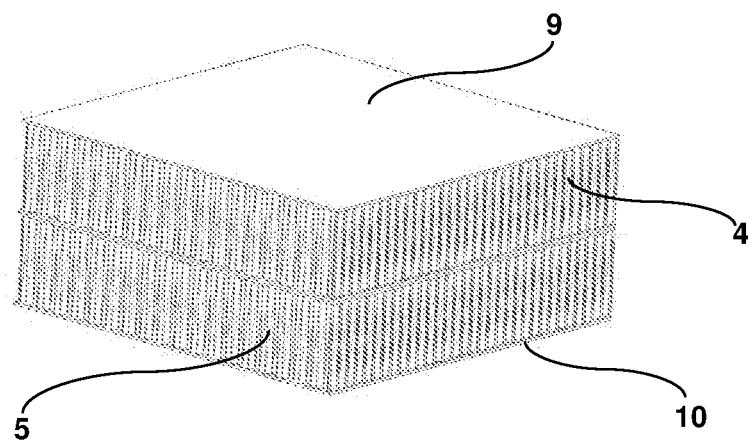
FIG. 2 is a perspective view of the first heat flux converter, the heater, the first sample and the second sample.
Figure 3:
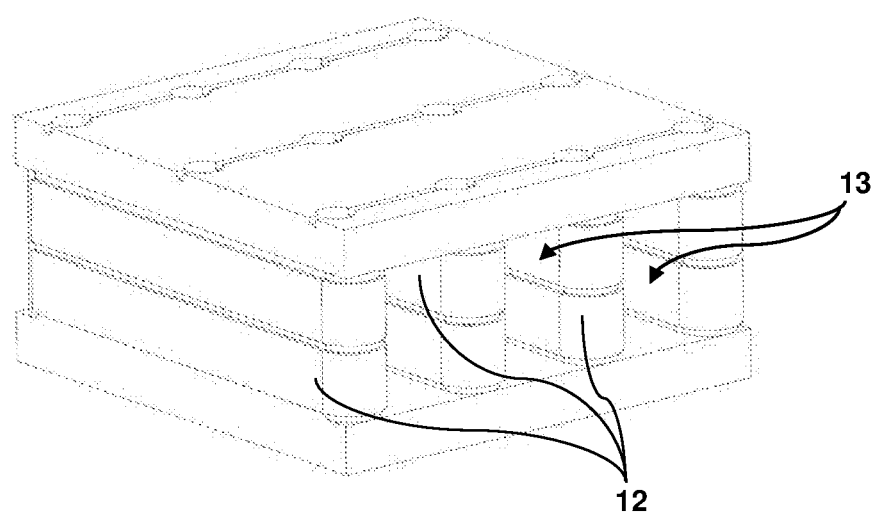
FIG. 3 is a perspective view of the heater and the tape heater.

All the parts illustrated in figures are individually assigned a reference numeral and the corresponding terms of these numbers are listed below.

1—Measurement mechanism
2—Body
3—Vacuum chamber
4—First sample
5—Second sample
6—Piston
7—Cooler
8—Heater
9—First heat flux converter
10—Second heat flux converter
11—Control unit
12—Tape heater
13—Air duct The measurement mechanism (1) comprises a body (2); a vacuum chamber (3) which is located on the body (2) and in which a measurement process is performed; a first sample (4) and a second sample (5) between which a heat transfer occurs, which are placed in the vacuum chamber (3) and contact each other; a piston (6) which provides the first sample (4) and the second sample (5) to continuously contact each other; and a cooler (7) which is located below the first sample (4) and the second sample (5). By means of carrying out the measurement in the vacuum chamber (3), the measurement is performed by isolating it from the outer environment. Therefore, measurement accuracy is obtained. By means of the piston (6), continuous contact between the first sample (4) and the second sample (5) is provided.

The measurement mechanism (1), which is the subject matter of the present invention, comprises a heater (8)

located between piston (6) and the first sample (4), a first heat flux converter (9) located between the heater (8) and the first sample (4), and a second heat flux converter (10) located between the second sample (5) and the cooler (7). Due to the fact that the samples (4, 5) are located between the heater (8) and the cooler (7), the heat is provided to flow through the samples (4, 5) in a unidirectional way. The first heat flux converter (9) and the second heat flux converter (10) measure the heat change on the samples (4, 5), and provide determining thermal contact resistances thereof.

In an embodiment of the invention, the measurement mechanism (1) comprises a control unit (11) which provides comparing the information received from the first heat flux converter (9) and the second heat flux converter (10). Thanks to the control unit (11), data received from the first heat flux converter (9) and the second heat flux converter (10) are compared so that thermal contact resistances of the samples (4, 5) are able to be determined.

In an embodiment of the invention, the measurement mechanism (1) comprises a first heat flux converter (9) which is located so as to completely cover the first sample (4), and a second heat flux converter (10) which is located so as to substantially cover the second sample (5). Due to the fact that the heat flux converters substantially cover the samples (4, 5), information regarding heat conductivity is able to be obtained at all regions of the samples (4, 5). Thus, measurement can be easily performed on the non-homogenous samples (4, 5).

In an embodiment of the invention, the measurement mechanism (1) comprises a heater (8) having a plurality of tape heaters (12) which are located in parallel side by side. By locating the tape heaters (12) side by side, heating process is performed. Therefore, a unidirectional heat flux is generated.

In an embodiment of the invention, the measurement mechanism (1) comprises a heater (8) having at least one air duct (13) which is located between the tape heaters (12). Air ducts are provided between the tape heaters (12). Therefore, heat is used in a more efficient way and a homogenous heating is provided.

In an embodiment of the invention, the measurement mechanism (1) comprises tape heaters (12) which are connected to each other by parallel circuits. Thus, the tape heaters (12) can be used independently of each other. The tape heaters (12) can be controlled by the user from a heat source.

With the present invention, there is achieved a measurement mechanism (1) which provides more accurate and easier measurement due to the heat flux converters which are able to perform measurement at all regions of the samples since they completely cover the samples (4, 5).

The invention claimed is:

1. A measurement mechanism (1) comprising:
   a body (2);
   a vacuum chamber (3) which is located on the body (2) and in which a measurement process is performed;
   a first sample (4) and a second sample (5) between which a heat transfer occurs, which are placed in the vacuum chamber (3) and contact each other;
   a piston (6) which provides the first sample (4) and the second sample (5) to continuously contact each other;
   a cooler (7) which is located below the first sample (4) and the second sample (5);
   a heater (8) located between piston (6) and the first sample (4) and having a plurality of tape heaters (12) which are located in parallel side by side, a first heat flux converter (9) located between the heater (8) and the first sample (4); and
   a second heat flux converter (10) located between the second sample (5) and the cooler (7), wherein said first heat flux converter (9) and second heat flux converter (10) measure the heat change on the samples (4, 5).

2. The measurement mechanism (1) according to claim 1, comprising a control unit (11) which provides comparing the information received from the first heat flux converter (9) and the second heat flux converter (10).

3. The measurement mechanism (1) according to claim 1, wherein the first heat flux converter (9) covers the first sample (4), and wherein the second heat flux converter (10) covers the second sample (5).

4. The measurement mechanism (1) according to claim 1, wherein the heater (8) comprises at least one air duct (13) which is located between the tape heaters (12).

5. The measurement mechanism (1) according to claim 1, comprising tape heaters (12) which are connected to each other by parallel circuits.

* * * * *